United States Patent [19]
Mochizuki

[11] Patent Number: 5,459,087
[45] Date of Patent: Oct. 17, 1995

[54] METHOD OF FABRICATING A MULTI-LAYER GATE ELECTRODE WITH ANNEALING STEP

[75] Inventor: Akira Mochizuki, Tokyo, Japan

[73] Assignee: NEC Corporation, Tokyo, Japan

[21] Appl. No.: 101,353

[22] Filed: Aug. 3, 1993

[30] Foreign Application Priority Data

Aug. 3, 1992 [JP] Japan .................................. 4-206352

[51] Int. Cl.⁶ ........................ H01L 21/265; H01L 21/44; H01L 21/48
[52] U.S. Cl. .............................. 437/39; 437/184; 437/192
[58] Field of Search .................................. 437/177–179, 437/40, 41, 228, 912, 203, 187, 189, 39, 192, 200–202; 257/283, 284; 148/DIG. 100

[56] References Cited

U.S. PATENT DOCUMENTS

| 4,638,551 | 1/1987 | Einthoven | 29/571 |
| 4,923,823 | 5/1990 | Kohno | 437/41 |
| 4,927,782 | 5/1990 | Davey et al. | 437/184 |
| 5,032,541 | 7/1991 | Sakamoto et al. | 437/203 |
| 5,087,950 | 2/1992 | Katano | 257/472 |
| 5,143,856 | 9/1992 | Iwasaki | 437/22 |
| 5,155,053 | 10/1992 | Atkinson | 437/40 |
| 5,278,099 | 1/1994 | Maeda | 437/192 |
| 5,358,885 | 10/1994 | Oku et al. | 437/39 |

FOREIGN PATENT DOCUMENTS

| 55-120132 | 9/1980 | Japan . |
| 61-196554 | 8/1986 | Japan . |
| 63-213933 | 9/1988 | Japan . |
| 2-102544 | 4/1990 | Japan . |
| 2-285643 | 11/1990 | Japan . |
| 3-242927 | 10/1991 | Japan . |

OTHER PUBLICATIONS

"Schottky barriers on ordered and disordered surfaces of GaAs(110)", *J. Vac. Sci. Technol.*, vol. 15, No. 4, Jul./Aug., 1978, By A. Amith et al., pp. 1344–1352.

"Sputtered Schottky barrier solar cells on p-type GaAs", *Appl. Phys. Lett.*, vol. 43, No. 6, Sep. 15, 1983, By M. Edweeb et al., pp. 572–574.

"Electrical characterization of Schottky contacts of Au, Al, Gd, and Pt on n-type and p-type GaAs", *J. Appl. Phys.*, vol. 61, No. 8, Apr. 15, 1987, By T. Okumura et al., pp. 2955–2961.

Wolf, Stanley and Richard Tauber, "Silicon Processing For The VLSI Era", Lattice Press, Sunset Beach, Calif., vol. 1, 1986.

Wolf, Stanley, "Silicon Processing for the VLSI Era", Lattice Press, Sunset Beach Calif., vol. 2, 1990.

Primary Examiner—Olik Chaudhuri
Assistant Examiner—Brian K. Dutton
Attorney, Agent, or Firm—Young & Thompson

[57] ABSTRACT

The invention provides a method of forming a gate electrode on a channel layer in a field effect transistor. A first layer made of a first metal having a heat resistivity is formed on a gate formation region of a surface of a channel layer on a semiconductor substrate. The substrate is subjected to a heat treatment so as to recover a damage of the channel layer caused by the formation of the first layer. A second layer made of a second metal having a heat resistivity is formed on a surface of the first layer. A third layer made of a third metal having a low electrical resistivity is formed on a surface of the second layer thereby a gate electrode comprising the first, second and third layers is formed on the channel layer free from any damage caused by the formation steps.

9 Claims, 9 Drawing Sheets 5,459,087

METHOD OF FABRICATING A MULTI-LAYER GATE ELECTRODE WITH ANNEALING STEP

BACKGROUND OF THE INVENTION

The present invention relates to a method of fabricating field effect transistors, and more particularly to a method of fablicating a gate of a field effect transistor made of semiconductor compounds such as GaAs.

Metal-Schottky gate field effect transistors (MESFET) have been well known in the art as having excellent properties of high frequency. The Shottky gate field effect transistors have gates formed by the Schottky contacts or metal-semiconductor contacts. They have many applications due to their high frequency performance to micro-wave low noise amplifier devices, high power amplifier devices, and oscillators. The properties and reliabilities of the Schottky gate field effect transistors strongly depend upon the quality of the Schottky gates. The quality of the Schottky gate further depends upon the height of the potential barrier appearing at the metal-semiconductor contact or the Schottky contact in which carriers experience such potential barrier when moving across a face defined by the Schottky contact from the metal region into the semiconductor region. Such potential barrier will hereinafter be referred to as a potential barrier $\phi_B$. The potential barrier $\phi_B$ is ideally associated with the number given by subtracting the affinity of electrons from the work function $\phi_m$ of metal, namely "$\phi_m\text{-}\chi$". Actually, the potential barrier $\phi_B$ is defined by a Fermi level pinning and thus depends primarily upon an interface state rather than the work function of the metal. It was known that in the case of GaAs as a semiconductor compound, the potential barrier $\phi_B$ is relatively large, for example, approximately 0.7 V to 0.9 V which is suitable to form the Schottky contact.

In addition, the GaAs Schottky gate field effect transistor has the following advantages. That transistor exhibits a relatively small surface recombination and thus has a desirable ideality factor "n" which is near to 1. The Schottky contact in the GaAs transistor both has an interfacial structure exhibiting a thermal stability and has a relatively small resistance. Further, the GaAs compound semiconductor has a strong adhesion with a substrate, a low stress, a high heat resistivity and a facility in micro-lithography.

So far as the material of the gate electrode of the MESFET is concerned, Aluminum is useful as having a small resistivity but having high heat resistivity and reliability, in addition to its ease of manufacture. The well known technique such as a lift-off using an electron beam evaporation is available to make the Al gate.

The Al gate is, however, engaged with a disadvantage in appearance of the electro-migration causing voids in the Al metal. This renders the reliability of the Al gate to become increasingly low as the minimization of the device size represented by a submicron gate length is realized. Further, it appears that a native oxide film is formed on a surface of the Al gate thereby vendering electrical connection inferior. But at present, there seems to be no material which can replace aluminum as the Schottky gate. In any event, in the art the GaAs MESFET having the Al Schottky gate are influential.

A conventional method of fabricating the GaAs MESFET having the Al Schottky gate will be described with reference to FIGS. 1A to 1D.

With reference to FIG. 1A, a semi-insulating GaAs substrate 1 is prepared to form a GaAs MESFET. A channel layer 2 or an active layer is formed on the semi-insulating GaAs layer by epitaxial growth or ion-implantation. An insulating film 3 such as silicon oxide film $SiO_2$ is deposited on the channel layer 2. The insulating film 3 is subjected to a selective etching thereby an opening is formed in a gate formation region on which a gate will be formed. The opening of the insulating film 3 is defined by a gate length $L_g$.

With reference to FIG. 1B, a metal film 12 having a heat resistivity is deposited on the entire surface of the device, and thus both on the surface of the insulating film 3 and in the opening thereof. The metal film 12 may be made of tungsten W, molybdenum Mo and tungsten silicide $WSi_x$. A part of the metal film 12 will become a Schottky gate electrode of the MESFET. To reduce the gate resistance, a secondary metal film 6 made of a metal having a low resistivity such as gold Au is further deposited on the entire surface of the metal film 12. So far as the combination of the two metal layers 12 and 6 is concerned, it is possible to insert a titanium Ti film or a platinum Pt film between the metal layers 12 and 6 in order to prevent any diffusion between the tungsten silicide $WSi_x$ and the gold Au and further to improve the adhesion thereof. For example, it is useful to form a metal multi-layer comprising Ti-Pt-Au on the heat resistive layer 12.

With reference to FIG. 1C, a photo-resist film 10 is patterned to be used as a mask pattern for etching the metal film 6 of Ti-Pt-Au by use of an ion-milling method. Further, according to the mask pattern 10, the heat resistive metal film 12 of the tungsten silicide $WSi_x$ is selectively etched by a dry etching using a $CF_4$ gas. As a result, the gate electrode comprising the heat resistive $WSi_x$ film 12 and the low resistive metal film 6 is defined. The photo-resist film 10 is stripped thereafter.

With reference to FIG. 1D, contact holes are formed in the insulating film 3. An Au-Ge-Ni alloy is deposited by a vacuum evaporation method and then so patterned that the Au-Ge-Ni alloy remains in the contact holes of the insulating film 3. The remaining portions of the Au-Ge-Ni alloy serve as source and drain electrodes 7 and 8. As a result, the formation of the GaAs MESFET is completed.

As described above, the MESFETs are characterized by high frequency properties. Improvement in the high frequency of the MESFETs mean that the gate length $L_g$ will be shortened. Shortening the gate length $L_g$ to improve the high frequency property tends to minimize a section area of the gate electrode. The minimization of the section area of the gate electrode, however, tends to increase the gate resistance thereby rendering electric properties inferior. To recover such inferiority in the electrical properties due to the enlargement of the resistance, the low resistive metal film 6 is formed on the heat resistive metal film 12 having a high resistivity. The interface between the two metal films 12 and 6 making up the gate electrode is designed to have a large area, for example, a T-shaped section for reduction of the gate resistance.

Such T-shaped gate electrode is, however, associated with problems in the property of the high frequency and in the reliability. As described above, the heat resistive tungsten silicide film 12 is deposited by the sputtering or a magnetron sputtering. The use of the magnetron sputtering damages the channel layer. This results in inferiorities of the property of the high frequency and the reliability. Consequently, it is required to develop a novel method of forming a Schottky gate on the MESFETs free from the above problems.

SUMMARY OF THE INVENTION

Accordingly, it is a primary object of the present invention to provide a method of forming a metal-Schottky gate field effect transistor (MESFET).

It is a further object of the present invention to provide a method of forming a metal-Schottky gate field effect transistor (MESFET) possessing excellent electrical properties.

It is a still further object of the present invention to provide a method of forming a metal-Schottky gate field effect transistor (MESFET) exhibiting a high frequency performance.

It is yet a further object of the present invention to provide a method of forming a metal-Schottky gate field effect transistor (MESFET) having a low gate resistance.

It is a further more object of the present invention to provide a method of forming a metal-Schottky gate field effect transistor (MESFET) having a high reliability.

It is another object of the present invention to provide a method of forming a metal-Schottky gate field effect transistor (MESFET) free from any damage at a Schottky interface of a channel layer in forming a Schottky gate.

The above and other objects, features and advantages of the present invention will be apparent from the following description.

The present invention provides a method of forming a gate electrode on a channel layer in a field effect transistor. A first layer made of a first metal having a heat resistivity is formed on a gate formation region of a surface of a channel layer on a semiconductor substrate. The substrate is subjected to a heat treatment so as to recover damage of the channel layer caused by the formation of the first layer. A second layer made of a second metal having a heat resistivity is formed on a surface of the first layer. A third layer made of a third metal having a low electrical resistivity is formed on a surface of the second layer thereby a gate electrode comprising the first, second and third layers is formed on the channel layer free from any damage caused by the formation process.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention provides a method of forming a metal-Schottky gate field effect transistor. A channel layer is formed on a main face of a semiconductor substrate. An insulating film is formed on the channel layer and then subjected to a selective etching to form an opening of the insulating film on a gate formation region. A first metal film having a heat resistivity is deposited by an evaporation method on the entire surface of the device. The first heat resistive metal film may be made of tungsten silicide WSi. The device is subsequently subjected to a heat treatment at a temperature in the range from 350° C. to 550° C. The heat treatment of the device is able to recover the damage of the channel layer in the evaporation process. A second metal film having a heat resistivity is further deposited by an evaporation method on the first heat resistive metal film. A third metal film having a low electrical-resistivity is further deposited by an evaporation method on the second heat resistive metal film. The first, second and third metal films are subjected to a patterning so as to form a gate electrode comprising laminations of the first, second and third metal films in which the first heat resistive metal film subjected to the heat treatment in the gate electrode is in contact directly with the semiconductor channel layer. The insulating film is selectively etched for a subsequent formation of drain and source electrodes on the channel layer.

Figure 5:
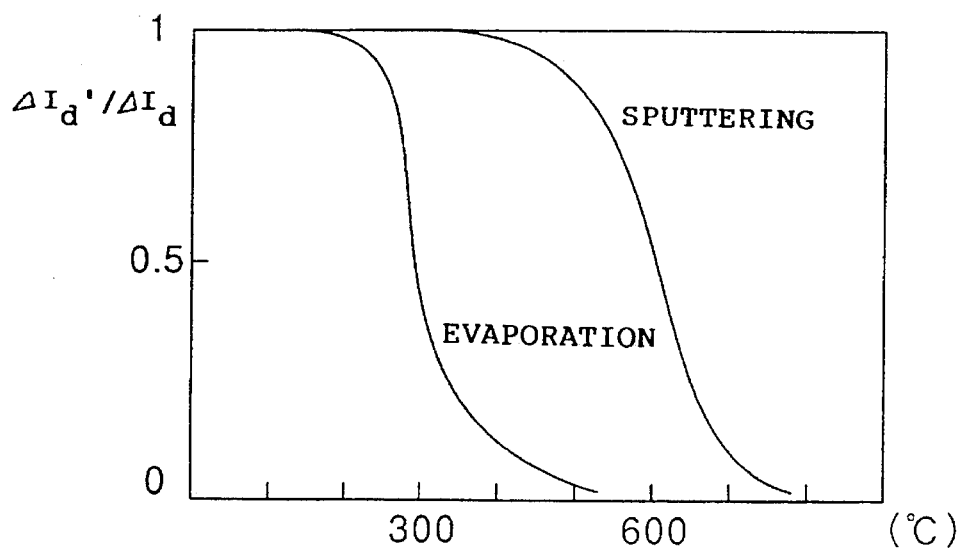
FIG. 5 is a diagram illustrative of a ratio of variations of drain currents after and before a heat treatment.

So far as the deposition method of the first heat resistive film on the channel layer is concerned, an electron beam evaporation method is much more preferable than sputtering. To investigate the deposition methods, tungsten is deposited on the channel layer by sputtering and the electron beam evaporation for a subsequent heat treatment of the device to recover the damage of the channel layer. The variations of the drain currents before and after the heat treatment being referred to as $\Delta I_d$ and $\Delta I_d'$ are measured. FIG. 5 illustrates a ratio of the variation of the measured drain currents. The variation of the drain current is defined by a difference between a drain current of direct current and a drain current when a radio-frequency signal is applied to the gate electrode. The variation of the drain current depends upon the interface state under the gate electrode. The ratio of the measured variation of the drain currents indicates a degree of the recovery of the channel layer damage. Lowering the ratio of the drain current variation down toward zero indicates that the damage of the channel layer is being recovered by the heat treatment. When the tungsten is deposited by the sputtering, the ratio of the drain current variation is dropped by a heat treatment of approximately 600° C. In contrast, in case of the electron beam evaporation, the ratio of the drain current variation is dropped by a heat treatment of approximately 300° C. It is therefore understood that the electron beam evaporation of the tungsten on the channel layer permits a lower heat treatment to recover the damage of the channel layer rather than the sputtering.

Figure 6:
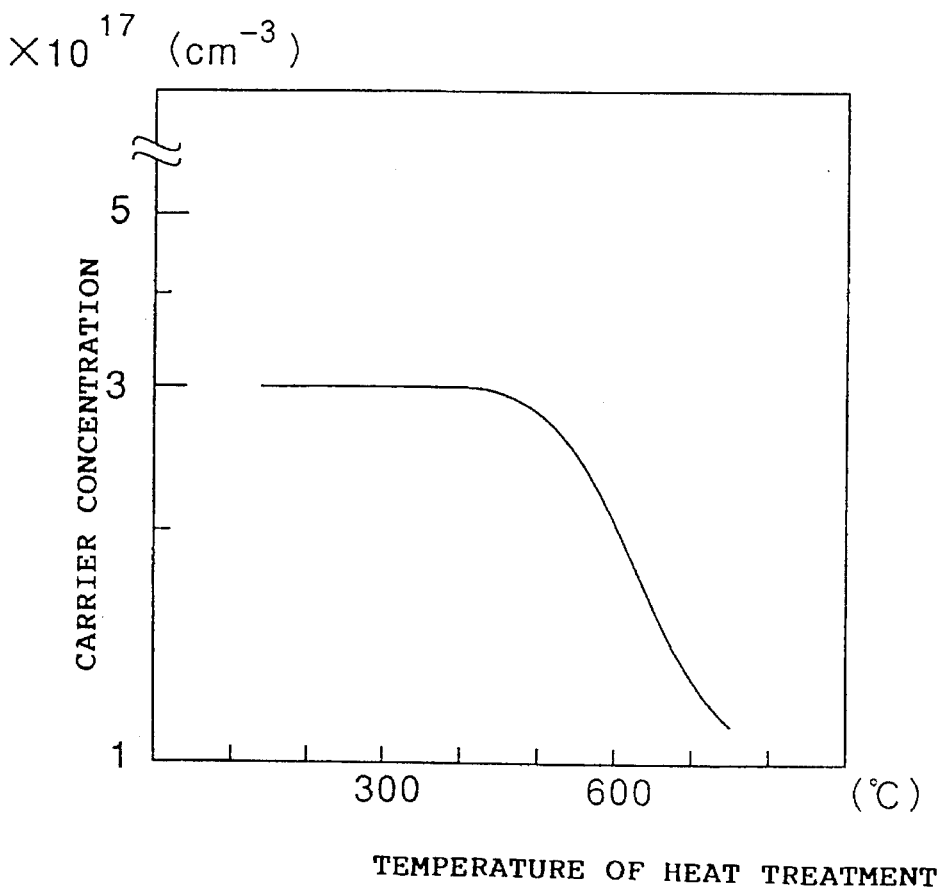
FIG. 6 is a diagram illustrative of a carrier concentration of GaAs epitaxial layer doped with Si.

FIG. 6 illustrates a carrier concentration of the GaAs epitaxial layer doped with Si in association with a temperature of the heat treatment. From FIG. 6, it is understood that a heat treatment higher than 600° C. lower the carrier concentration. It is required to suppress the temperature of the heat treatment less than 550° C.

A method of forming a metal-Schottky gate field effect transistor (MESFET) of a first embodiment according to the present invention will be described with reference to FIGS. 2A to 2D.

Figure 1A:
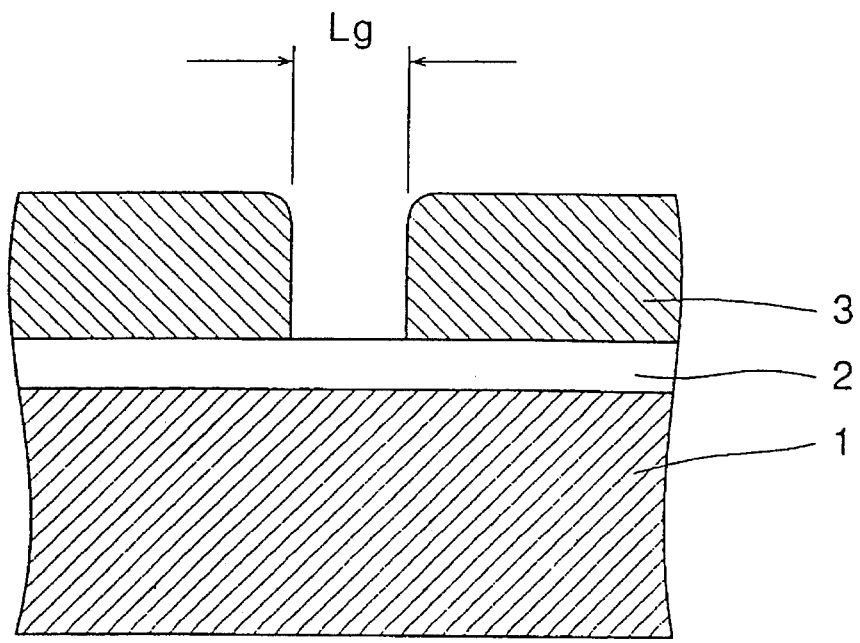
FIGS. 1A to 1D are fragmentary cross sectional elevation views illustrative of sequential steps involved in the conventional method of fabricating the metal-Schottky gate field effect transistor in the prior art.
Figure 1B:
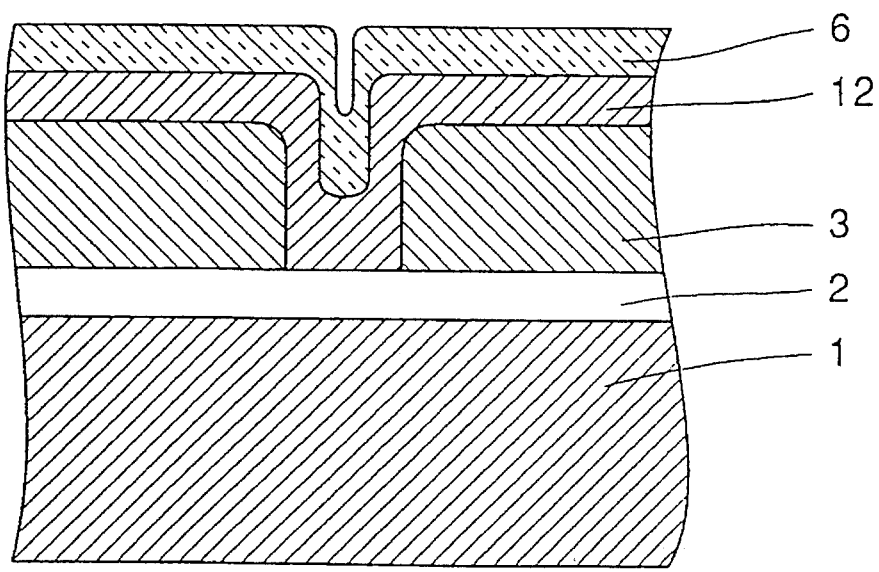
Figure 1C:
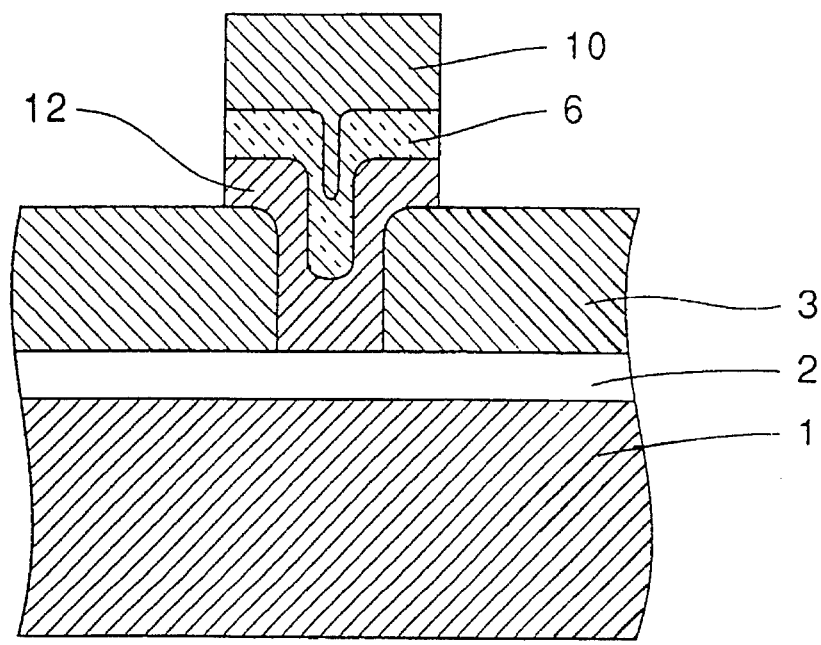
Figure 1D:
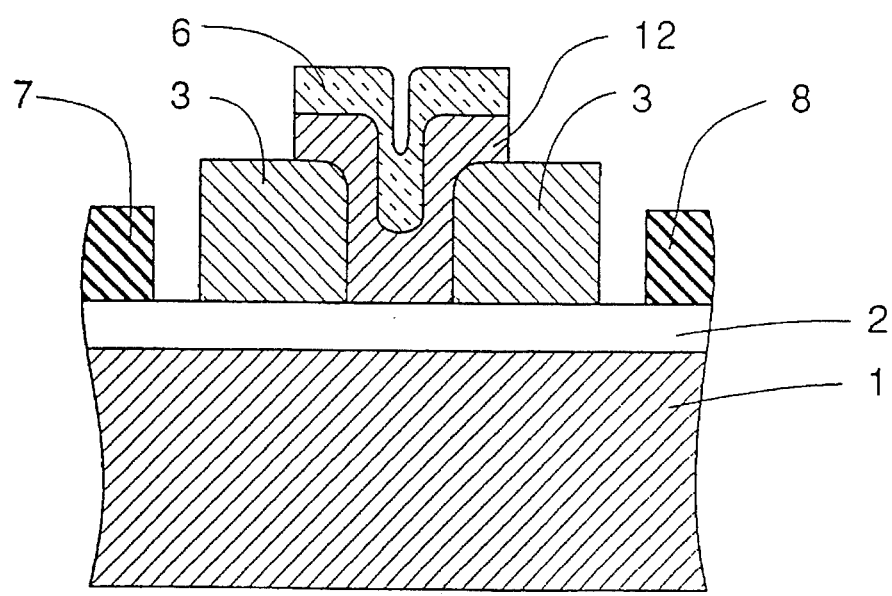
Figure 2A:
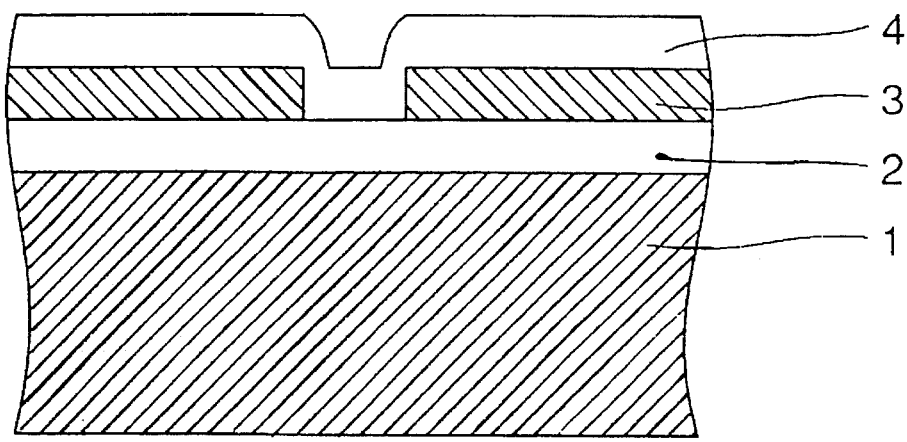
FIGS. 2A to 2D are fragmentary cross sectional elevation views illustrative of sequential steps involved in a novel method of fabricating a metal-Schottky gate field effect transistor of a first embodiment according to the present invention.

In FIG. 2A, a semi-insulating GaAs substrate 1 is prepared to form a MESFET. A channel layer 2 or an active layer is formed on a surface of the semi-insulating GaAs substrate 1. The channel layer 2 comprises an epitaxial layer doped with silicon Si at a dopant concentration of approximately $3 \times 10^{17}$ cm$^{-3}$. After that, a part of the channel layer in an isolation region which is not illustrated is removed by a mesa-etching. An insulating film 3 is deposited on a surface of the channel layer 2 by a chemical vapor deposition. The insulating film 3 is made of silicon dioxide and has a thickness of approximately 150 nanometers. A photo-resist mask pattern which is not illustrated is prepared on the insulating film 3. According to the photo-resist mask pattern, the insulating film 3 is selectively etched by reactive ion etching (RIE) to form an opening of the insulating film 3 in a gate formation region, after which the photo-resist mask pattern is removed. A first metal film 4 made of tungsten W having a heat resistivity is deposited on the entire surface of the device up to a thickness in the range from 150 nanometers to 200 nanometers by the electron beam evaporation. As a result, the first tungsten metal film 4 is formed on the insulating film 3 and in the opening.

Figure 2B:
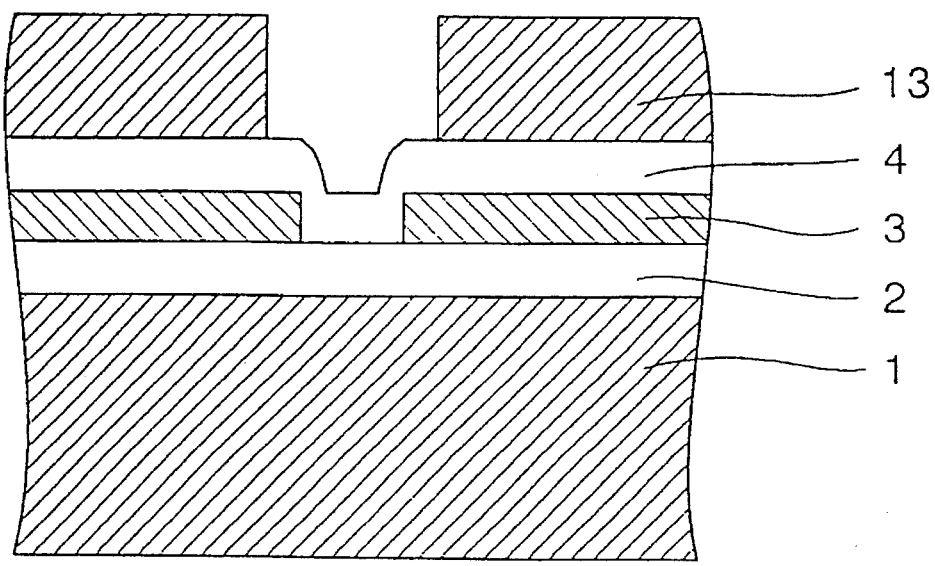

In FIG. 2B, an insulating film 13 made of silicon dioxide SiO$_2$ having a thickness of approximately 500 nanometers is deposited on the first tungsten metal film 4 by a chemical vapor deposition. A heat treatment of the device is accomplished at a temperature in the range from 350° C. to 550° C. for 5 to 60 min. so as to recover almost all of the damage of the channel layer due to the electron beam evaporation and further to improve the adhesion between the channel layer 2 and the first tungsten metal film 4. After that, a photo-resist mask pattern which is not illustrated is prepared on the insulating film 13. According to the photo-resist mask pattern, the insulating film 13 is selectively etched by a reactive ion etching (RIE) using a CF$_4$ gas to form an opening of the insulating film 13 in a gate formation region, after which the photo-resist mask pattern is removed.

Figure 2C:
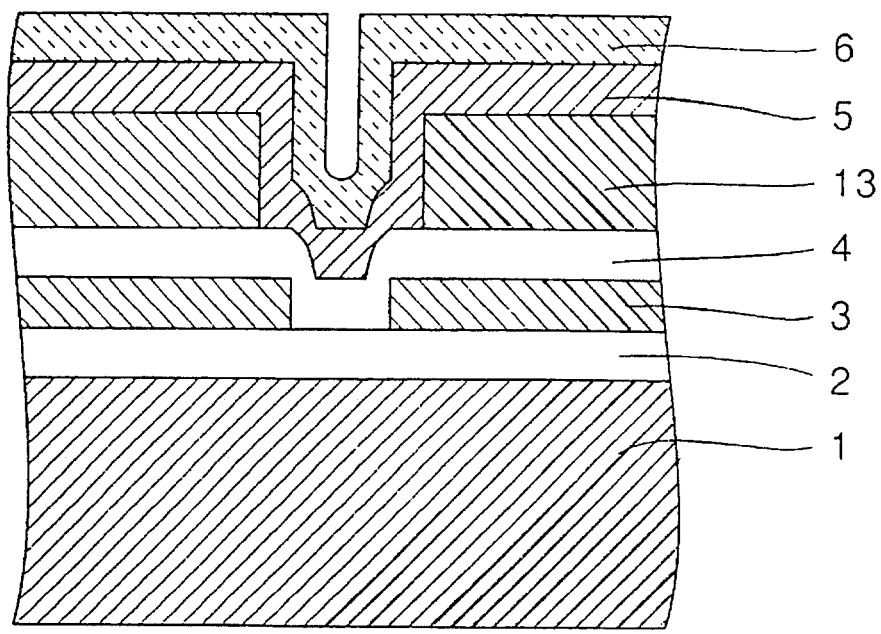

In FIG. 2C, a second metal film 5 made of tungsten silicide W$_5$Si$_3$ having a heat resistivity is deposited on the entire surface of the device up to a thickness in the range from 100 nanometers to 300 nanometers by sputtering. As a result, the second tungsten silicide film 5 is formed on the insulating film 13 and in the opening thereof. The tungsten silicide W$_5$Si$_3$ used as the material the second metal film 5 has a thermal stability and a small heat stress at the interface with the GaAs layer. Then, under the thermal condition less than 850° C., almost no variation of the potential barrier of the Schottky interface nor variation of the ideality factor appears in that case. A metal multilayer 6 having a low resistivity is deposited on the second tungsten silicide film 5 by sputtering. The low resistive multilayer 6 comprises a titanium Ti layer having a thickness in the range from 10 nanometers to 30 nanometers, a platinum Pt layer having a thickness in the range from 10 nanometers to 30 nanometers and a gold Au layer having a thickness in the range from 300 nanometers to 500 nanometers.

Figure 2D:
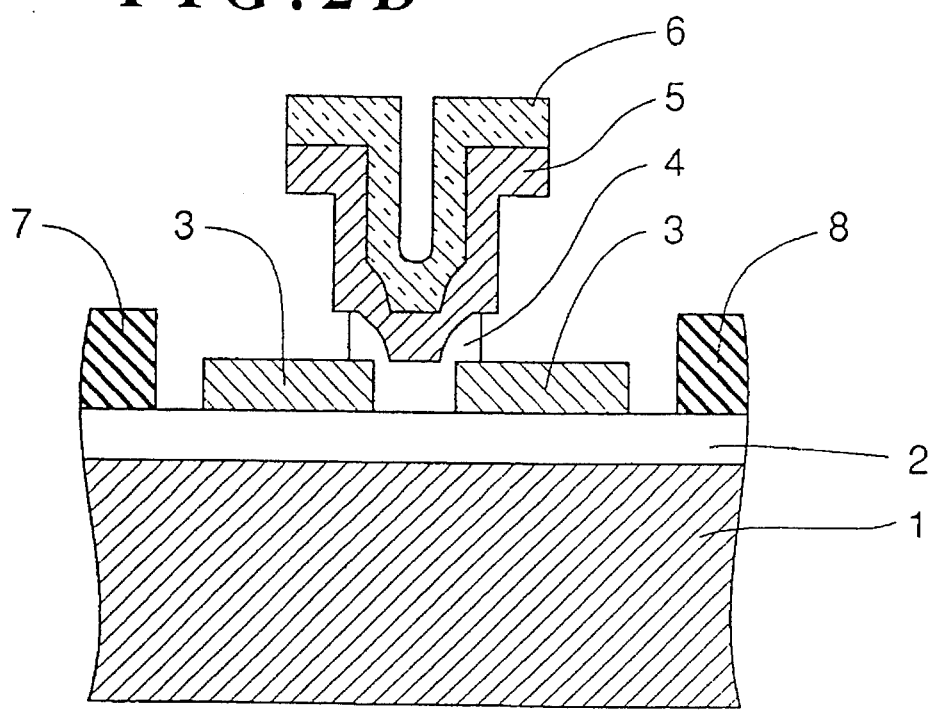

In FIG. 2D, a photo-resist mask pattern which is not illustrated is prepared on the metal multilayer 6. According to the photo-resist mask pattern, only the metal multilayer 6 is selectively etched by the ion-milling method. According to the photo-resist mask pattern, the second heat resistive tungsten silicide film 5 is selectively etched by the dry etching method. Further, only the insulating film 13 is selectively removed by use of a buffered fluoride acid wherein the second heat resistive tungsten silicide film 5 and the low resistive metal multilayer 6 are not etched by the buffered fluoride acid. According to the photo-resist mask pattern, the first heat resistive tungsten film 4 is selectively etched by a reactive ion etching (RIE) using CF$_4$ or SF$_6$ gas to define a gate electrode comprising the remaining first and second heat resistive metal films 4 and 5 and the low resistive metal multilayer 6. After the photo-resist mask pattern is removed, the insulating film 3 of silicon dioxide is selectively removed to form contact holes for a subsequent formation of source and drain electrodes 7 and 8 of Au-Ge-Ni by use of a lift-off method thereby the formation of the GaAs MESFET is completed.

Alternatively, etching the insulating film 3 of silicon dioxide SiO$_2$ by use of the buffered fluoride acid prior to the formation of the source and drain electrodes 7 and 8 is available to reduce a gate capacitance for improvement in the electrical property.

In the process of the formation of the GaAs MESFET, the electron beam evaporation to form the first heat resistive tungsten film 4 provides a relatively small damage to the channel layer 2. The heat treatment at the temperature in the range from 350° C. to 550° C. after forming the insulating film 13 is able to recover almost all of the damage of the channel layer 2. Therefore, the resultant channel layer 2 has almost no damage thereby the resultant GaAs MESFET is free from the inferiority in the electrical property and thus has a high frequency performance and a low resistance. The resultant GaAs MESFET also has a high reliability.

A method of forming a metal-Schottky gate field effect transistor (MESFET) of a second embodiment according to the present invention will be described with reference to FIGS. 3A to 3D.

Figure 3A:
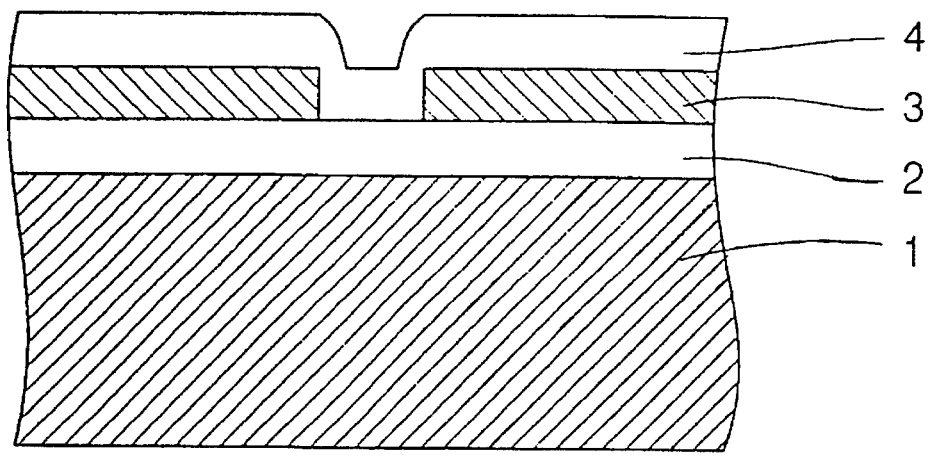
FIGS. 3A to 3D are fragmentary cross sectional elevation views illustrative of sequential steps involved in a novel method of fabricating a metal-Schottky gate field effect transistor of a second embodiment according to the present invention.

In FIG. 3A, a semi-insulating GaAs substrate 1 is prepared to form a MESFET. A channel layer 2 or an active layer is formed on a surface of the semi-insulating GaAs substrate 1. The channel layer 2 comprises an epitaxial layer doped with silicon Si at a dopant concentration of approximately $3 \times 10^{17}$ cm$^{-3}$. After that, a part of the channel layer in an isolation region which is not illustrated is removed by a mesa-etching. An insulating film 3 is deposited on a surface of the channel layer 2 by a chemical vapor deposition. The insulating film 3 is made of silicon dioxide and has a thickness of approximately 150 nanometers. A photo-resist mask pattern which is not illustrated is prepared on the insulating film 3. According to the photo-resist mask pattern, the insulating film 3 is selectively etched by the reactive ion etching (RIE) to form an opening of the insulating film 3 in a gate formation region, after which the photo-resist mask pattern is removed. A first metal film 4 made of tungsten W having a heat resistivity is deposited on the entire surface of the device up to a thickness in the range from 150 nanometers to 200 nanometers by the electron beam evaporation. As a result, the first tungsten metal film 4 is formed on the insulating film 3 and in the opening.

Figure 3B:
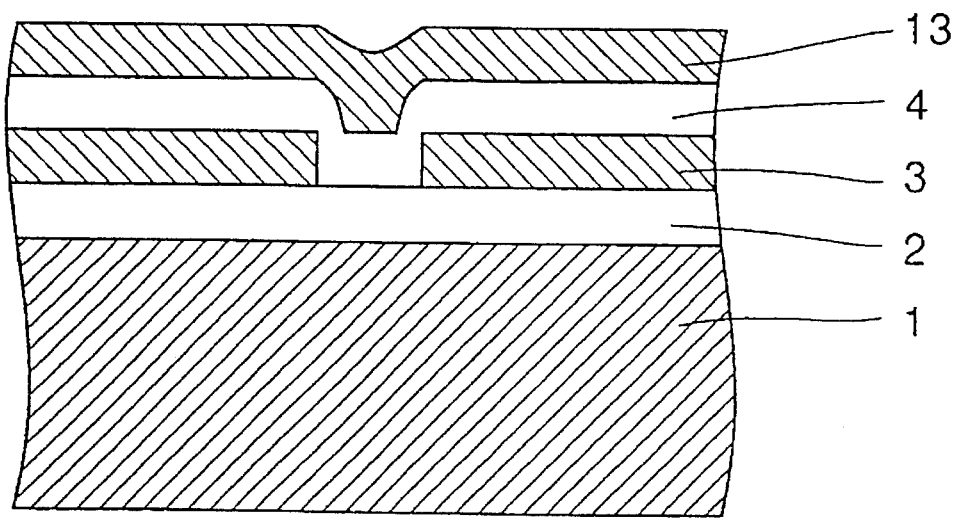

In FIG. 3B, an insulating film 13 made of silicon dioxide SiO$_2$ having a thickness in the range from approximately 100 nanometers to 300 nanometers is deposited on the first tungsten metal film 4 by a chemical vapor deposition. A heat treatment of the device is accomplished at a temperature in the range from 350° C. to 550° C. for 5 to 60 min. in an atmosphere of $N_2$, $H_2$ and Ar so as to recover almost all of the damage of the channel layer due to the electron beam evaporation and further to improve the adhesion between the channel layer 2 and the first tungsten metal film 4. Alternatively, the test treatment may be accomplished without a deposition of the insulating film 13, provided in an atmosphere containing $AsH_3$ to secure a stoichiometry of the channel layer 2 and the semi-insulating GaAs substrate 1. After that, the insulating film 13 is completely removed by use of a buffered fluoride acid.

Figure 3C:
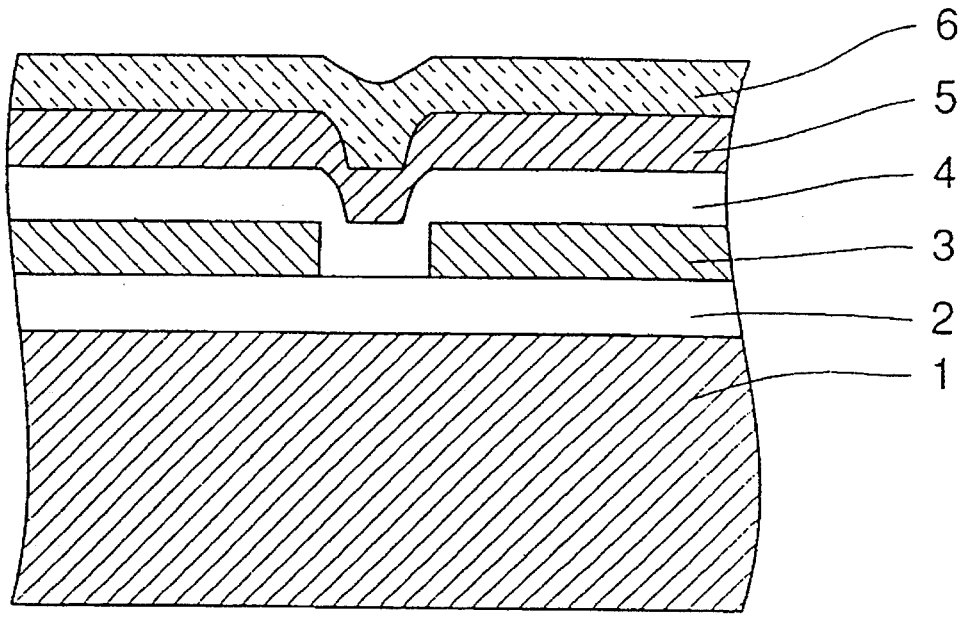

In FIG. 3C, a second metal film 5 made of tungsten silicide $W_5Si_3$ having a heat resistivity is deposited on the entire surface of the first heat resistive tungsten film 4 up to a thickness in the range from 100 nanometers to 300 nanometers by sputtering. A metal multilayer 6 having a low resistivity is deposited on the second tungsten silicide film 5 by sputtering. The low resistive multilayer 6 comprises a titanium Ti layer, a platinum Pt layer and a gold Au layer.

Figure 3D:
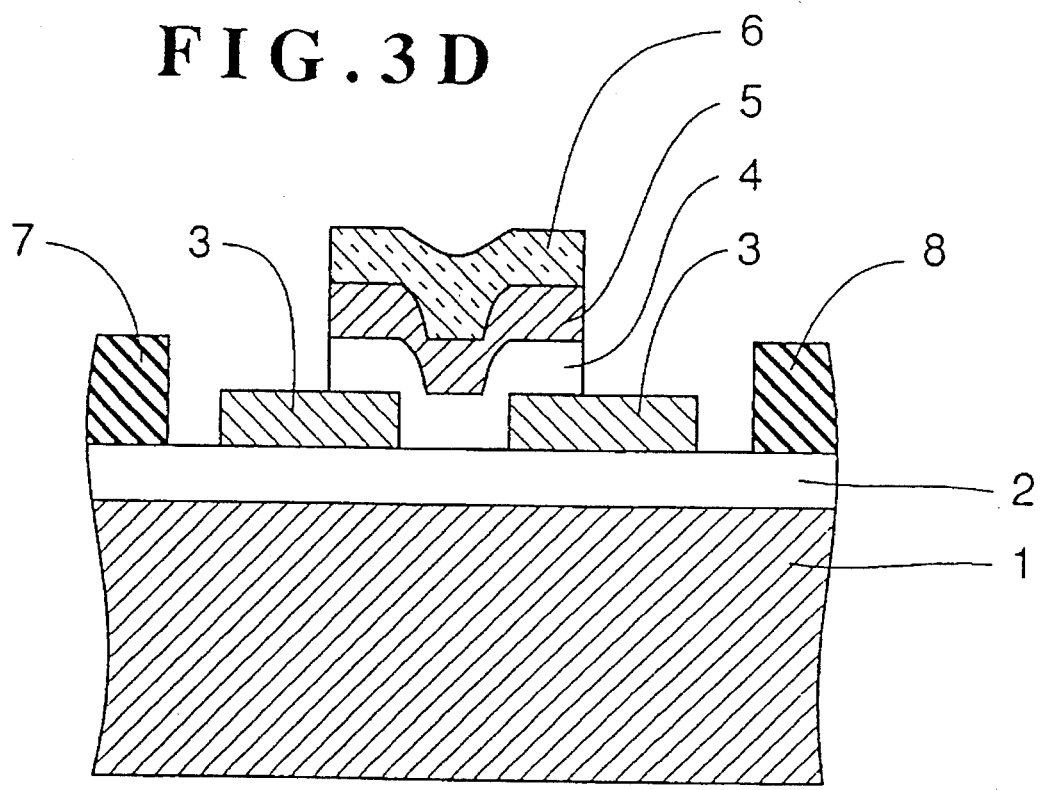

In FIG. 3D, a photo-resist mask pattern which is not illustrated is prepared on the metal multilayer 6. According to the photo-resist mask pattern, only the metal multilayer 6 is selectively etched by the ion-milling method. According to the photo-resist mask pattern, the second heat resistive tungsten silicide film 5 and the first heat resistive tungsten film 4 are selectively etched by the dry etching method so as to define a gate electrode comprising the remaining first and secod heat resistive metal films 4 and 5 and the low resistive metal multilayer 6. After the photo-resist mask pattern is removed, the insulating film 3 of silicon dioxide is selectively removed to form contact holes for a subsequent formation of source and drain electrodes 7 and 8 of Au-Ge-Ni by use of a lift-off method thereby the formation of the GaAs MESFET is completed.

The above described gate formation method of the second embodiment is superior to that of the first embodiment in the facility of the micro-lithography due to the relatively flat gate electrode.

Alternatively, etching the insulating film 3 of silicon dioxide $SiO_2$ by use of the buffered fluoride acid prior to the formation of the source and drain electrodes 7 and 8 is possible to reduce a gate capacitance for improvement in the electrical property.

It the process of the formation of the GaAs MESFET, the electron beam evaporation to form the first heat resistive tungsten film 4 provides a relatively small damage to the channel layer 2. The heat treatment at the temperature in the range from 350° C. to 550° C. after forming the insulating film 13 is able to recover almost all of the damage of the channel layer 2. Therefore, the resultant channel layer 2 has almost no damage thereby the resultant GaAs MESFET is free from the inferiority in the electrical property and thus has a high frequency performance and a low electrical resistance. The resultant GaAs MESFET also has a high reliability.

A method of forming a metal-Schottky gate field effect transistor (MESFET) of a third embodiment according to the present invention will be described with reference to FIGS. 4A to 4D.

Figure 4A:
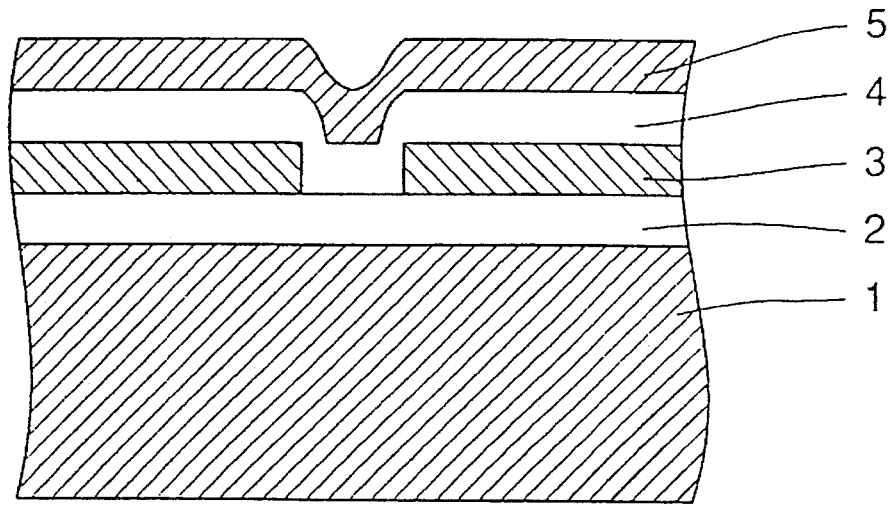
FIGS. 4A to 4D are fragmentary cross sectional elevation views illustrative of sequential steps involved in a novel method of fabricating a metal-Schottky gate field effect transistor of a third embodiment according to the present invention.

In FIG. 4A, a semi-insulating GaAs substrate 1 is prepared to form a MESFET. A channel layer 2 or an active layer is formed on a surface of the semi-insulating GaAs substrate 1. The channel layer 2 comprises an epitaxial layer doped with silicon Si at a dopant concentration of approximately $3\times10^{17}$ $cm^{-3}$. After that, a part of the channel layer in an isolation region which is not illustrated is removed by a mesa-etching. An insulating film 3 is deposited on a surface of the channel layer 2 by a chemical vapor deposition. The insulating film 3 is made of silicon dioxide and has a thickness of approximately 150 nanometers. A photo-resist mask pattern which is not illustrated is prepared on the insulating film 3. According to the photo-resist mask pattern, the insulating film 3 is selectively etched by the reactive ion etching (RIE) to form an opening of the insulating film 3 in a gate formation region, after which the photo-resist mask pattern is removed. A first metal film 4 made of tungsten W having a heat resistivity is deposited on the entire surface of the device up to a thickness in the range from 150 nanometers to 200 nanometers by the electron beam evaporation. As a result, the first tungsten metal film 4 is formed on the insulating film 3 and in the opening. An insulating film not illustrated and made of silicon dioxide $SiO_2$ and having a thickness in the range from approximately 100 nanometers to 300 nanometers is deposited on the first tungsten metal film 4 by a chemical vapor deposition. A heat treatment of the device is accomplished at a temperature in the range from 350° C. to 550° C. for 5 to 60 min. in an atmosphere of $N_2$, $H_2$ and Ar so as to recover almost all of the damage of the channel layer due to the electron beam evaporation and further to improve the adhesion between the channel layer 2 and the first tungsten metal film 4. Alternatively, the heat treatment may be accomplished without a deposition of the insulating film, provided in an atmosphere containing $AsH_3$ to secure a stoichiometry of the channel layer 2 and the semi-insulating GaAs substrate 1. After that, the insulating film is completely removed by use of a buffered fluoride acid. A second metal film 5 made of tungsten silicide $W_5Si_3$ having a heat resistivity is deposited on the entire surface of the first heat resistive tungsten film 4 up to a thickness in the range from 100 nanometers to 300 nanometers by sputtering.

Figure 4B:
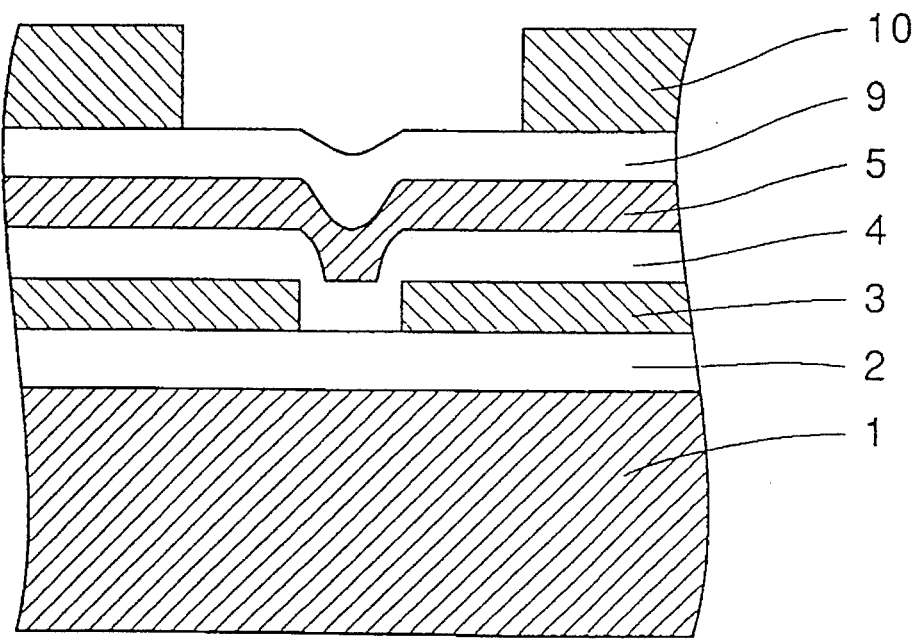

In FIG. 4B, a metal multilayer 9 having a low resistivity is deposited on the second tungsten silicide film 5 by sputtering or the electron beam evaporation. The low resistive multilayer 9 comprises a titanium Ti layer having a thickness in the range from 10 nanometers to 30 nanometers, a platinum Pt layer having a thickness in the range from 10 nanometers to 40 nanometers and a gold Au layer having a thickness in the range from 20 nanometers to 50 nanometers. The low resistive metal multilayer 9 serves as a conductive pass for plating. A photo-resist mask pattern 10 having an opening on and in the vicinity of a gate formation region is prepared on the low resistive metal multilayer 9.

Figure 4C:
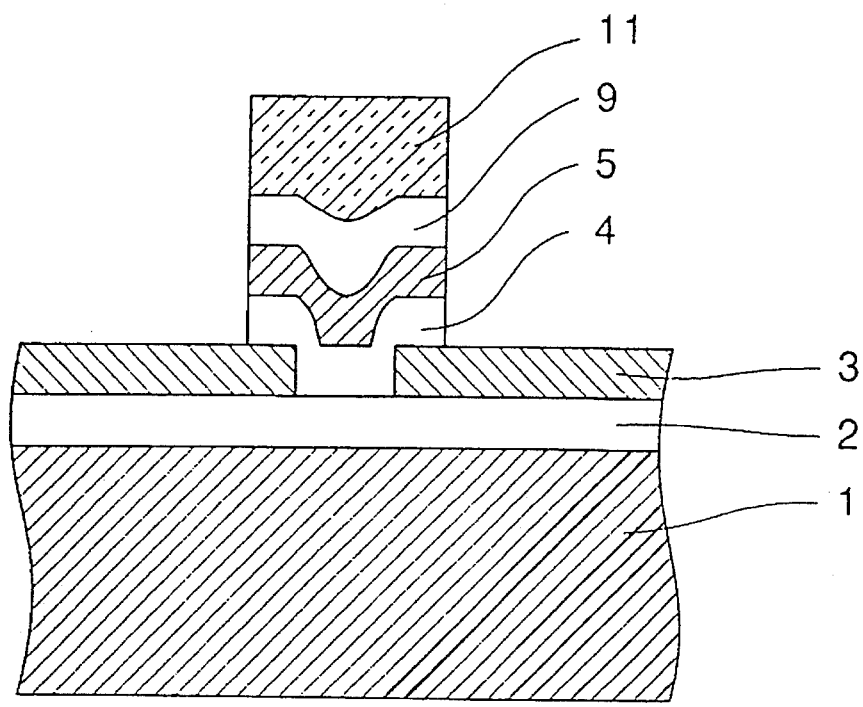

In FIG. 4C, further a photo-resist mask pattern which is not illustrated and having an opening on the gate formation region is prepared on a surface of the low resistive metal multilayer 9 exposed through the opening of the photo-resist mask pattern 10. According to the photo-resist mask pattern not illustrated, a plating layer 11 of gold Au is formed on the exposed surface of the low resistive metal multilayer 9 and thereafter the photo-resist mask pattern not illustrated is removed. With using the plating layer 11 as a mask, the low resistive metal multilayer 9 is selectively etched by the ion-milling method. According to the gold plating layer mask pattern 11, the second heat resistive tungsten silicide film 5 and the first heat resistive tungsten film 4 are selectively etched by the dry etching method so as to define a gate electrode comprising the remaining first and second heat resistive metal films 4 and 5, the low resistive metal multilayer 9 and the gold plating laye 11.

Figure 4D:
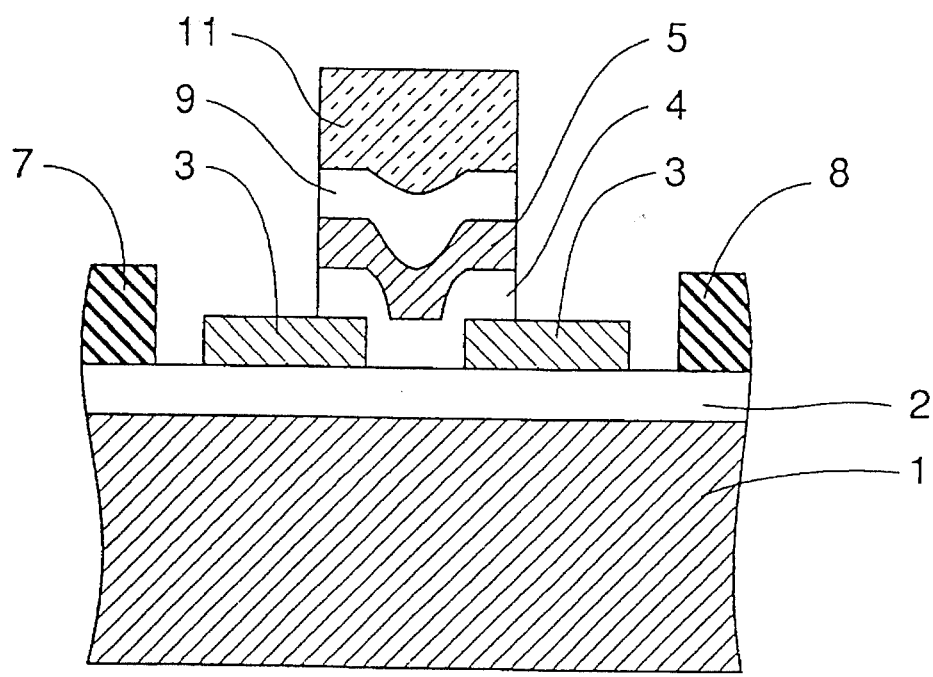

In FIG. 4D, the insulating film 3 of silicon dioxide is selectively removed to form contact holes for a subsequent formation of scurce and drain electrodes 7 and 8 of Au-Ge-Ni by use of a lift-off method thereby the formation of the GaAs MESFET is completed.

The above described gate formation method of the third embodiment is superior to those of the first and second embodiments in the large surface area of the gate electrode which is able to reduce the gate resistance.

Alternatively, etching the insulating film 3 of silicon dioxide $SiO_2$ by use of the buffered fluoride acid prior to the formation of the source and drain electrodes 7 and 8 is available to reduce a gate capacitance for improvement in the electrical property.

In the process of the formation of the GaAs MESFET, the electron beam evaporation to form the first heat resistive tungsten film 4 provides a relatively small damage to the channel layer 2. The heat treatment at the temperature in the range from 350° C. to 550° C. is able to recover almost all of the damage of the channel layer 2. Therefore, the resultant channel layer 2 has almost no damage thereby the resultant GaAs MESFET is free from the infericrity in the electrical property and thus has a high frequency performance and a low electrical resistance. The resultant GaAs MESFET also has a high reliability.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the present invention which fall within the sprit and scope of the invention.

What is claimed is:

1. A method of forming a gate electrode on a channel layer in a field effect transistor comprising the steps of:

carrying out an electron beam evaporation method to deposit a heat resistive metal layer on an epitaxial layer formed on a semiconductor substrate whereby said epitaxial layer receives a damage;

subjecting said epitaxial layer to a heat treatment at a temperature in the range of from 300° C. to 550° C. so as to recover said damage of said epitaxial layer and also to improve the adhesion between sid heat resistive metal layer and said epitaxial layer;

depositing a tungten silicide ($W_5Si_3$) layer by sputtering on said heat resistive metal layer; and depositing a Ti-Pt-Au multi-layer on said tungsten silicide layer, said multi-layer serving as a gate electrode.

2. The method as claimed in claim 1, wherein said heat treatment is carried out in an atmosphere including at least $AsH_3$ to keep stoichiometries of said epitaxial layer and said semiconductor substrate.

3. The method as claimed in claim 1, wherein said heat treatment is carried out in an atmosphere comprising $N_2$, $H_2$ and Ar after a chemical vapor deposition of a silicon oxide film on said heat resistive metal layer.

4. The method as claimed in claim 1, wherein said heat resistive metal layer is made of tungsten.

5. The method as claimed in claim 1, wherein said heat resistive metal layer has a thickness in the range of from 150 to 200 nanometers.

6. The method as claimed in claim 1, wherein said semiconductor substrate comprises a GaAs substrate.

7. The method as claimed in claim 1, wherein said Ti-Pt-Au multi-layer is deposited by sputtering.

8. The method as claimed in claim 1, wherein said Ti-Pt-Au multi-layer is deposited by electron beam evaporation.

9. The method as claimed in claim 1, wherein said heat treatment is continued for 5 to 60 minutes.

* * * * *